US006992753B2

(12) United States Patent
Krähmer et al.

(10) Patent No.: US 6,992,753 B2
(45) Date of Patent: Jan. 31, 2006

(54) PROJECTION OPTICAL SYSTEM

(75) Inventors: Daniel Krähmer, Aalen (DE); Eric Eva, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 144 days.

(21) Appl. No.: 10/743,815

(22) Filed: Dec. 24, 2003

(65) Prior Publication Data
US 2005/0140954 A1 Jun. 30, 2005

(51) Int. Cl.
G03B 27/42 (2006.01)
(52) U.S. Cl. .............................. 355/53; 355/67; 501/54; 359/350; 359/833; 65/17.3; 65/17.4; 65/30.1; 430/311
(58) Field of Classification Search ...................... None
See application file for complete search history.

(56) References Cited

U.S. PATENT DOCUMENTS

| 5,229,872 | A | 7/1993 | Mumola |
| 5,296,891 | A | 3/1994 | Vogt et al. |
| 5,523,193 | A | 6/1996 | Nelson |
| 6,295,841 | B1 | 10/2001 | Allan et al. |
| 6,339,505 | B1 | 1/2002 | Bates |
| 6,376,401 | B1 * | 4/2002 | Kondo et al. ................. 501/54 |
| 6,451,719 | B1 * | 9/2002 | Yamagata ..................... 501/54 |
| 6,543,254 | B2 | 4/2003 | Allan et al. |
| 6,782,716 | B2 * | 8/2004 | Moore et al. ................ 65/30.1 |
| 2001/0030798 | A1 | 10/2001 | Fujinoki et al. |
| 2003/0037568 | A1 * | 2/2003 | Fujiwara et al. ............ 65/17.4 |
| 2003/0051507 | A1 | 3/2003 | Ikuta et al. |
| 2003/0115904 | A1 | 6/2003 | Kuhn et al. |
| 2003/0115905 | A1 | 6/2003 | Kuhn et al. |
| 2003/0119652 | A1 | 6/2003 | Kuhn et al. |
| 2004/0235635 | A1 * | 11/2004 | Borrelli et al. ............... 501/54 |
| 2005/0068644 | A1 * | 3/2005 | Ikuta et al. ................. 359/833 |

FOREIGN PATENT DOCUMENTS

| DE | 10159959 A1 | 6/2003 |
| DE | 10159961 A1 | 6/2003 |
| DE | 10159962 A1 | 7/2003 |
| EP | 0483752 B1 | 5/1992 |
| EP | 123091 A2 | 8/2002 |

OTHER PUBLICATIONS

C. Van Peski, "Behavior of Fused Silica Under 193 nm Irradiation", International Sematech publication, Technology Transfer #00073974A-TR, Jul. 25, 2000,International Sematech.

J. M. Algots et al., "Compaction and Rarefaction of Fused Silica with 193-nm Excimer Laser Exposure", Optical Microlithography XVI, Feb. 25-28, 2003, final draft submitted for Proceedings of SPIE vol. #5040, corresponding pp. 1639-1650, SPIE—The International Society for Optical Engineering.

V.S. Khotimchenko, et al., "Determining the Content of Hydrogen Dissolved in Quartz Glass Using the Methods of Raman Scattering and Mass Spectrometry", Zhurnal Prikladnoi Spektroskopii, 46(6), pp. 987-991, 1986 (with English-language summary at end).

D.M. Dodd, et al., "Optical Determinations of OH in Fused Silica", J. Appl. Physics, p. 3911, 1966.

* cited by examiner

Primary Examiner—D. Rutledge
(74) Attorney, Agent, or Firm—Jones Day

(57) ABSTRACT

Radiation-induced damage to a lens material in a projection exposure system is reduced by selection of maximum design fluence values $H_D$ for lenses and at least one lens made of a material having a characteristic transition point $T_{RC}$ after exposure to a given amount of radiation, wherein, for instance, $T_{RC}<0.8$. $H_D$ among other relationships and/or characteristics of the lenses.

38 Claims, 6 Drawing Sheets

PROJECTION OPTICAL SYSTEM

BACKGROUND OF THE INVENTION

1. Field of Industrial Applicability

The present invention generally relates to a projection exposure apparatus for photolithography, and, more particularly, to a projection exposure apparatus adapted to reduce a decrease in performance due to radiation-induced damage of lens material(s) comprised therein.

2. Prior Art

Lithographic processes are commonly used in the manufacture of semiconductor elements, such as integrated circuits (ICs), LSIs, liquid crystal elements, micropatterened members such as thin-film magnetic heads and micromechanical components. A projection exposure apparatus used for lithography generally comprises an illumination optical system with a light source and a projection optical system. Light from the illumination optical system illuminates a patterning structure (mask) with a given pattern and the projection optical system transfers an image of the patterning structure pattern onto a photo-sensitive substrate. The image of the mask may be reduced in size by the projection optical system so as to project a smaller image of the patterning structure onto the substrate.

The trend towards ever more sophisticated semiconductor devices requires semiconductor elements of smaller size and higher complexity which, in turn, makes higher demands on the resolution achievable in projection optical systems. Improved resolution is generally achieved by increasing the numerical aperture of the projection optical system as well as decreasing the wavelength of the exposure radiation (illumination light), with recently used illumination light having wavelengths of 248 nm and below.

However, the transition to ever shorter wavelengths is associated with a number of problems. In particular, the number of suitable materials for lenses in the projection optical system as well as in the illumination optical system having a large enough transmittance at short wavelengths is very limited. Furthermore, the materials that are satisfactory in terms of transmittance often suffer damage upon exposure to radiation. Whilst it was, at first, observed that certain lens materials will undergo compaction, i.e. densification, it was later noticed that some materials show the opposite effect, i.e. rarefaction, which involves an expansion of the lens material.

Fused silica (sometimes referred to as "quartz" in a more general manner) is the most common material used in recently introduced projection exposure apparatus employing short wavelengths for exposure (193 nm and 248 nm being the most common). Upon exposure to high intensity radiation, exposed areas of a lens of a given material have been found to undergo a change in density, in particular densification or rarefaction. The change in density of an exposed area in a lens in a projection exposure apparatus can generally be assumed to have a detrimental effect on the optical properties of the lens. In particular, wavefront distortion is indicative of densification or rarefaction and can be measured and determined by suitable interferometric methods, for example. An increase in density, for instance, of the lens material shortens the physical path through the material, but also alters the refractive index, which is generally increased to a greater extent, so that the net effect is an increase in the optical path. For rarefaction phenomena, the opposite applies. Usually, densification and rarefaction are quantified in terms of the change of the product of refractive index and path length, commonly referred to as optical path length difference OPD.

The susceptibility of fused silica materials to UV-induced damage is correlated with the materials' chemical and physical properties, which, in turn, are closely linked to methods of manufacturing and/or treating the material(s).

A lens material that is transparent to UV-radiation and which has, at least so far, not been found to be subject to such structural alterations that are associated with changes in optical properties is calcium fluoride, $CaF_2$. However, for calcium fluoride to be suitable for use in optical lenses, it needs to be in the form of single crystals which are not only costly but also technically difficult to manufacture so that the resulting limited supply somewhat constrains its practical use.

Accordingly, fused silica material is still the most widely used option in terms of lens materials suited for photolithography with UV-radiation.

The observation of the above described phenomena has been an incentive for both materials scientists and projection exposure apparatus designers to find solutions to the problems created by the structural change of the respective lens material manifesting itself as a density and refractive index change over the lifespan of a projection exposure system.

In U.S. Pat. No. 6,295,841 B1 by Allan et al., a method of precompacting fused silica and a method for making a fused silica stepper lens are disclosed, the entire content of which is incorporated herein by reference.

In U.S. Pat. No. 6,339,505 B1 by Bates, a method for radiation projection and a lens assembly for semiconductor exposure tools are disclosed, the entire content of which is incorporated herein by reference. In particular, a lens assembly comprising a first lens element of a material that densifies upon exposure to radiation and a second lens material that rarefies upon exposure to radiation are described. The lens materials are supposed to be selected such that the change in optical path length difference of one lens will exactly compensate for that of the other lens. Exact compensation, however, has proven difficult, if not almost impossible to achieve in practice.

There remains a need for a projection exposure system which is adapted to reduce a decrease in performance of the optical system comprised therein due to radiation-induced damage to the lens material(s), and in particular a radiation-induced change in density of the lens material(s).

SUMMARY OF THE INVENTION

In view of this and other needs, the present invention aims at reducing the problem of deterioration of optical performance in a projection exposure system due to radiation-induced damage to lens material(s).

Under a first aspect, the invention provides a projection exposure system comprising: an illumination optical system including a light source for illuminating a patterning structure; a projection optical system for projecting an image of the illuminated patterning structure onto a substrate; the illumination optical system and the projection optical system each comprising a plurality of lenses; wherein each of the lenses has a maximum design fluence value ($H_D$) associated therewith, the maximum design fluence value ($H_D$) representing a predetermined expected maximum fluence that the respective lens will be exposed to during a standard mode of operation of the projection exposure apparatus; at least one lens being made of a lens material selected from a first group of lens materials wherein each lens material of the first group has a characteristic transition point ($T_{RC}$) after exposure to a given number of pulses of radiation of a given pulse length, wherein each lens material of the first group will have rarified after exposure to the given number of pulses of radiation of the given pulse length having any fluence value below its transition point ($T_{RC}$), and wherein each lens material of the first group will have densified after exposure to the given number of pulses of radiation of the given pulse length having any fluence value above its transition point ($T_{RC}$); and wherein the transition point ($T_{RC}$) of each lens material of the first group satisfies the following condition:

$$T_{RC} < 0.8 \cdot H_D$$

wherein $T_{RC}$ represents the transition point of the respective lens material, wherein $H_D$ represents the maximum design fluence value of the respective lens, and wherein at least one of the following is fulfilled:

(i) at least one lens is made of a first fused silica material comprised in the first group of lens materials, wherein a transmittance of the first fused silica material obeys the relationship $$T = 10^{-(k_0 + k_{ind}) \cdot l}$$

with

T denoting the transmittance, $k_0$ being an absorption coefficient of the first fused silica material before exposure to light of a wavelength of 193.4 nm, $k_0 + k_{ind}$ being a total absorption coefficient after the first fused silica material has been exposed to 160 million pulses of radiation having a fluence of 5 mJ/cm² and a wavelength of 193.4 nm, and l being a length of a path of light through the first fused silica material, and wherein the following condition is fulfilled:

$$k_{ind} < 10^{-3} \text{ cm}^{-1};$$

(ii) at least one lens is made of a first fused silica material comprised in the first group of lens materials, wherein a transmittance of the first fused silica material obeys the relationship $$T = 10^{-(k_0 + k'_{ind}) \cdot l}$$

with

T denoting the transmittance, $k_0$ being an absorption coefficient of the first fused silica material before exposure to light of a wavelength of 193.4 nm, $k_0 + k'_{ind}$ being a total absorption coefficient after the first fused silica material has been exposed to 100 billion pulses of radiation having a fluence of 200 µJ/cm² and a wavelength of 193.4 nm, and l being a length of a path of light through the first fused silica material, and wherein the following condition is fulfilled:

$$k'_{ind} < 10^{-3} \text{ cm}^{-1};$$

(iii) at least one lens is made of a first fused silica material comprised in the first group of lens materials, which first fused silica material comprises a fused silica material manufactured by depositing $SiO_2$-particles to form a porous soot body, followed by vitrification, which first fused silica material has a $H_2$-content of about $5 \cdot 10^{15}$ molecules/cm³ or more;

(iv) at least one lens is made of a first fused silica material comprised in the first group of lens materials, which first fused silica material comprises a fused silica material manufactured by depositing $SiO_2$-particles to form a porous soot body, followed by vitrification, which first fused silica material has an OH-content of about 50 ppm by weight or less, and preferably a $H_2$-content of about $10^{15}$ molecules/cm³ or more;

(v) more than 50% of a total number of the plurality of lenses in at least one of the illumination optical system and the projection optical system are made of a lens material selected from the first group of lens materials.

The at least one lens made of the first fused silica material may be the at least one lens being made of a lens material selected from the first group of lens materials or may be at least one lens out of the at least one lens being made of a lens material selected from the first group of lens materials.

Under a second aspect, the invention provides a projection exposure apparatus comprising: an illumination optical system including a light source for illuminating a patterning structure; a projection optical system for projecting an image of the illuminated patterning structure onto a substrate; the illumination optical system and the projection optical system each comprising a plurality of lenses; wherein each location on a surface of each lens has a design fluence value associated therewith, the design fluence value representing a predetermined expected fluence that the respective location on the surface of the lens will be exposed to during a standard mode of operation of the projection exposure apparatus; wherein each location on the surface of each lens has a design fluence gradient value associated therewith, the design fluence gradient value representing a predetermined expected change of the design fluence value per unit length; and wherein each lens has a first location with a maximum design gradient product ($P_D$) associated therewith, the maximum design gradient product representing a maximum product of the design fluence gradient value and the design fluence value at the location of the design fluence gradient value for the respective lens; at least one lens being made of a lens material selected from a second group of lens materials wherein each lens of the second group has a characteristic transition point ($T_{RC}$) after exposure to a given number of pulses of radiation of a given pulse length, wherein each lens material will have rarefied after exposure to the given number of pulses of radiation of the given pulse length having any fluence value below the transition point ($T_{RC}$), and wherein each lens material will have densified after exposure to the given the given number of pulses of radiation of the given pulse length having any fluence value above the transition point ($T_{RC}$); wherein each lens material further has a characteristic minimum value ($H_{min}$) associated therewith, the minimum value representing a fluence value causing the greatest extent of rarefaction in the lens material after exposure to the given number of pulses of radiation of the given pulse length, and wherein the minimum value $H_{min}$ of each lens material satisfies the following condition:

$$H_{min} < H_{GHmax}$$

wherein $H_{GHmax}$ represents the design fluence value at the location with the maximum design gradient product ($P_D$), $H_{min}$ represents the minimum value, and wherein at least one of the following is fulfilled:

(i) at least one lens is made of a first fused silica material comprised in the second group of lens materials, wherein a transmittance of the first fused silica material obeys the relationship $$T = 10^{-(k_0 + k_{ind}) \cdot l}$$

with

T denoting the transmittance, $k_0$ being an absorption coefficient of the first fused silica material before exposure to light of a wavelength of 193.4 nm, $k_0 + k_{ind}$ being a total absorption coefficient after the first fused silica material has been exposed to 160 million pulses of radiation having a fluence of 5 mJ/cm² and a wavelength of 193.4 nm, and l being a length of a path of light through the first fused silica material, and wherein the following condition is fulfilled:

$k_{ind} < 10^{-3}$ cm$^{-1}$;

(ii) at least one lens is made of a first fused silica material comprised in the second group of lens materials, wherein a transmittance of the first fused silica material obeys the relationship $T = 10^{-(k_0 + k'_{ind}) \cdot l}$ with T denoting the transmittance, $k_0$ being an absorption coefficient of the first fused silica material before exposure to light of a wavelength of 193.4 nm, $k_0 + k'_{ind}$ being a total absorption coefficient after the first fused silica material has been exposed to 100 billion pulses of radiation having a fluence of 200 µJ/cm² and a wavelength of 193.4 nm, and l being a length of a path of light through the first fused silica material, and wherein the following condition is fulfilled:

$k'_{ind} < 10^{-3}$ cm$^{-1}$;

(iii) at least one lens is made of a first fused silica material comprised in the second group of lens materials, which first fused silica material comprises a fused silica material manufactured by depositing SiO₂-particles to form a porous soot body, followed by vitrification, which first fused silica material has a H₂-content of about $5 \cdot 10^{15}$ molecules/cm³ or more;

(iv) at least one lens is made of a first fused silica material comprised in the second group of lens materials, which first fused silica material comprises a fused silica material manufactured by depositing SiO₂-particles to form a porous soot body, followed by vitrification, which first fused silica material has an OH-content of about 50 ppm by weight or less, and preferably a H₂-content of about $10^{15}$ molecules/cm³ or more;

(v) more than 50% of a total number of the plurality of lenses in at least one of the illumination optical system and the projection optical system are made of a lens material selected from the second group of lens materials.

The at least one lens made of the first fused silica material may be the at least one lens being made of a lens material selected from the second group of lens materials or may be at least one lens out of the at least one lens being made of a lens material selected from the second group of lens materials.

The term "fluence" refers to a radiation (beam) intensity per unit area and is usually measured in units of mJ/cm².

The term "fluence gradient value" refers to the amount of a gradient vector of the fluence values H in dependence on a location on a surface of a respective lens, as defined by x- and y-coordinates, which is given by $$\text{Fluence gradient value} = \sqrt{\left(\frac{\partial H(x,y)}{\partial x}\right)^2 + \left(\frac{\partial H(x,y)}{\partial y}\right)^2}.$$

The term "patterning structure" as used herein refers broadly to any means suited for endowing an illuminating light beam with a patterned cross-section, an image of which pattern (of the illuminated patterning structure) is projected onto the substrate. The patterning structure may be a mask or a reticle, for example. The term "reticle" is more generally associated with a mask a reduced image of which is projected onto the substrate, and the term "mask" generally refers to a non-reducing, i.e. 1:1 projection exposure. Mask or reticle types include binary, attenuating and alternating phase shift types, and various hybrid types. The mask/reticle may transmit or reflect the illumination light beam whilst imparting a patterned cross-section upon it. Programmable mirror arrays are further examples of patterning structures suitable for use with the present invention. One example of such an array is described, for instance, in U.S. Pat. No. 5,296,891, the entire content of which is incorporated by reference herein. An active, matrix-addressable surface light modulator is provided with a reflective surface whose individually addressed surface areas reflect incident light as diffracted light and whose non-addressed surface areas reflect light as undiffracted light. Undiffracted light is then filtered out and only the diffracted light permitted to pass to a projection lens. Thus, the matrix-addressable surface matrix is programmed to impart a desired pattern to the illumination light beam. An additional example of a programmable mirror array is disclosed in U.S. Pat. No. 5,523,193, the entire content of which is incorporated by reference herein. Illumination light strikes a spatial light modulator comprising a plurality of programmable mirror devices or pixels, which are electronically actuated to a defined position thus creating a pattern from which the illumination light beam is reflected towards the substrate or projection optical system, respectively or into an off position. Programmable LCD arrays are further examples of patterning structures suitable for use with the present invention. Such an array is disclosed in U.S. Pat. No. 5,229,872, for instance, the entire content of which is incorporated by reference herein. An illumination light beam is reflected from a face of a liquid crystal light valve having a reflective pattern of an image (reproduced from a cathode ray tube screen) and is directed through a projection optical system towards a substrate. Generally, light valves or illumination templates are additional terms used in connection with patterning structures.

In the following, a short summary of the new findings relating to a change of physical properties of a range of lens materials upon exposure to UV-radiation is given.

A series of experiments involving a variety of lens materials was carried out. Samples of each material were exposed to radiation pulses having fluence values in the order of those that a lens would actually be exposed to in a standard operating mode in a projection exposure apparatus. More precisely, the fluence values were chosen to be in the range of 0.01 to 0.5 mJ/cm². Each sample was exposed to 10 billion pulses of a 193 nm wavelength excimer laser light of a given fluence. The pulse length, or more precisely integral square pulse width, was about 25 ns. A change in physical properties resulting from the exposure of a sample to UV-radiation was assessed by measuring a change of the relative optical path length difference, i.e. the product of refractive index n and path length L through the material, divided by the thickness of the sample, i.e. the path length L through the sample before radiation exposure: $\Delta(n \cdot L)/L$. These measurements were carried out using an interferometric method.

It was found that the different lens materials do not show either rarefaction or compaction, but rather both phenomena. Which of the two phenomena occurs depends strongly on the fluence the lens material is exposed to and, at least to a certain extent, also on the total number of pulses the material was exposed to as well as the pulse length. In particular, it was found that a lens material can be characterised by its characteristic transition point ($T_{RC}$) after exposure to a given number of pulses of radiation of constant pulse length and constant wavelength. When the lens material has been exposed to the given number of pulses of radiation having fluence values smaller than the one indicated by the transition point ($T_{RC}$), the lens material will have rarefied. In contrast, when the lens material has been exposed to the given number of pulses of radiation having fluence values above the transition point ($T_{RC}$), the lens material will have densified. At the transition point ($T_{RC}$) itself, no structural change relating to the density of the lens is observed after exposure to the given number of pulses of radiation having a fluence value as indicated by the transition point value.

Some materials show relatively little or almost no rarefaction. Those materials are still meant to be encompassed by the present invention. If no transition point can be determined for these materials, they are attributed a transition point of zero for purposes of the present invention.

The transition point ($T_{RC}$) itself, however, is not necessarily a constant, but may vary to some degree with the total number of pulses of radiation of a given fluence that the lens material has been exposed to, as well as the pulse length (at constant wavelength of radiation). The value of the transition point ($T_{RC}$) may change by about 10% to 15% during an experiment involving 30 billion pulses, for instance. Therefore, the transition points ($T_{RC}$) and other characteristics of the lens materials are defined herein as characterising the material behaviour observed after exposure to a given number of pulses of radiation of a given pulse length and at a given wavelength. Preferably, the transition point is given for a specified number of pulses of radiation of a given pulse length, and most preferably 10 billion pulses of radiation of 25 ns pulse length, at constant wavelength. 10 billion pulses are typically used in an experiment sufficient to characterise density changes in a lens material. However, a different reference point, for instance a different number of pulses or a corresponding duration of radiation from a light source having continuous emission, may be chosen for the definition of the materials' characteristics without departing from the scope of the present invention as defined by the appended claims. Continuous emission may be regarded as an extreme case of pulsed emission, with the number of pulses being 1 and the pulse length approaching infinity. Rarefying or densifying behaviour of a lens material is also referred to with regard to a specified number of pulses of radiation and a specified pulse length. A lens material may densify first and, after further exposure to radiation, start to rarefy, or vice versa. The mechanisms underlying the radiation-induced density changes in the lens materials are not yet fully understood. The refractive index change caused by rarefaction shows a different dependency on the parameters pulse number, pulse length and fluence value than the refractive index change caused by compaction phenomena. One model for characterising compaction assumes a refractive index change caused by compaction to be proportional to $(k \cdot N \cdot H^2/t)^b$ wherein k is a material constant, N is the total number of pulses, H is the fluence, t is the pulse length and b an empirical constant. A refractive index change due to rarefaction, on the other hand, has been assumed to show an approximately linear dependence on the product of pulse number and fluence. The overall occurring refractive index change may be regarded as the sum of both functions.

In addition to the transition point ($T_{RC}$), a behaviour of a lens material upon exposure to light (of a given wavelength) can be further characterised by a characteristic minimum value ($H_{min}$) which represents a fluence value causing the greatest extent of rarefaction in the respective lens material after exposure to the given number of pulses of radiation of the given pulse length.

If not otherwise indicated, characteristics of lens materials as given herein were measured or assessed after the respective material was exposed to 10 billion pulses of radiation having a pulse length of about 25 ns at a wavelength of 193 nm.

Furthermore, a behaviour of a lens material upon exposure to light can be additionally characterised by a gradient of the relative optical path length difference $\Delta(n \cdot L)/L$ in the transition point $T_{RC}$ of the respective lens material.

Although birefringence was not measured, the structural change induced in the lens material is expected to lead to internal stress and thus to a change in refractive index and also birefringence. This is an important contribution to the degradation of projection lenses.

For a further evaluation how these findings can be used to improve on current lens systems in a projection exposure apparatus, a path of a beam of radiation through the optical systems needs to be taken into account since the particular path in a given design of a lens assembly results in different lenses being exposed to different fluence values. Moreover, gradients of fluence values across the surface of the lens are most likely encountered on surfaces of most of the lenses in a projection exposure apparatus.

When optimising a projection exposure system, a range of typical applications involving a number of possible illumination modes, i.e. distributions of illumination intensities across the pupil, source fluence values, field sizes and/or patterning structure layouts is taken into account, amongst other factors. Illumination setting, source fluence value and/or patterning structure layout and other parameters may change from application to application, depending on the specific requirements of the application, and may be set accordingly. A projection exposure apparatus may be used for just one kind of application or for a range of different applications throughout its lifetime. In the case of an excimer laser, for instance, the choice of source intensity or source fluence value generally depends on both application-related as well as economic factors. Typically, an upper limit of the source intensity or fluence value is influenced by considerations relating to the life-time of the laser and a lower limit of source intensity or fluence values set by a smallest acceptable throughput. The throughput depends on the wattage of illumination light reaching a photosensitive substrate rather than on the intensity per pulse so that, typically, a lower source intensity or fluence value would be used at a higher frequency. An excimer laser emitting light pulses of 193 nm wavelength, for instance, would be typically operated such that an energy per pulse falls in the range of 5 to 10 mJ/pulse and a frequency in the range of 2 to 10 kHz.

In view of the radiation-induced damage to the lens material(s), the choice of material for one or more lenses in the projection exposure system will be influenced by the application or number of applications the projection exposure system is used for. Since requirements may be different for different applications, a standard operating mode is defined for purposes of material selection. The standard operating mode may be the operating mode for an application which requires the highest source fluence values, for instance, or which would presumably cause the greatest amount of radiation-induced damage. Alternatively, if the projection exposure apparatus is mainly used for a given application, the standard operating mode may be made dependent on the requirements of that application. In other preferred embodiments, the standard operating mode may be chosen to represent a typical application. The standard operating mode preferably defines source fluence value or intensity per pulse and size of the illumination area, sigma value of the illumination, illumination setting and/or patterning structure layout.

For a given standard mode of operation with a given source fluence value, the fluence values on a surface of a lens will be different from this source fluence value as a result of the path of the light beam through a lens assembly, i.e. a plurality of lenses, and the resulting variation in the degree of collimation of the light beam. The fluence that a lens positioned closest to the substrate in the system is exposed to, for instance, will generally tend to be higher than a fluence the majority of the lenses are exposed to.

Given a set source fluence value for the light emitted by the light source in a chosen standard operating mode, and a given design of the lens assembly, each of the lenses will have a maximum fluence value associated therewith which depends on the position of that particular lens in the lens assembly. This maximum fluence value is referred to as the maximum design fluence value and represents a predetermined expected maximum fluence that the respective lens will be exposed to during a standard mode of operation of the projection exposure apparatus. Thus, a maximum design fluence value can be determined for each lens in a given lens assembly.

Furthermore, for any of the plurality of lenses, a distribution of fluence values over the surface of a lens is not even, so that gradients of fluence values per unit length of the surface result. Again, for a given standard mode of operation, the gradients observed will be related to the position of the lens in the lens assembly, i.e. depend on the design. As described above, each location on a surface of a lens has a design fluence value associated therewith. Likewise, each location on the surface of each lens has a design fluence gradient value associated therewith, which design fluence gradient value represents a predetermined expected change of the design fluence value per unit length.

The present invention generally relates to a projection optical system comprising an illumination optical system including a light source for illuminating a patterning structure and a projection optical system for projecting an image of the illuminated patterning structure onto a substrate, wherein the illumination optical system and the projection optical system each comprise a plurality of lenses.

Each of the lenses in the projection exposure apparatus has a maximum design fluence value associated therewith, the maximum design fluence value representing a predetermined expected maximum fluence that the respective lens will be exposed to during a standard mode of operation of the projection exposure apparatus.

According to the first aspect of the invention, at least one lens is made of a lens material selected from a first group of lens materials wherein each lens material of the first group has a characteristic transition point ($T_{RC}$) after exposure to a given number of pulses of radiation of a given pulse length, wherein each lens material of the first group will have rarefied after exposure to the given number of pulses of radiation of the given pulse length having any fluence value below its transition point ($T_{RC}$), and wherein each lens material of the first group will have densified after exposure to the given number of pulses of radiation of the given pulse length having any fluence value above its transition point ($T_{RC}$); and wherein the transition point ($T_{RC}$) of each lens material of the first group satisfies the following condition:

$$T_{RC} < 0.8 \cdot H_D$$

wherein $T_{RC}$ represents the transition point of the respective lens material (after exposure to the given number of pulses of radiation of the given pulse length), $H_D$ represents the maximum design fluence value of the respective lens (after exposure to the given number of pulses of radiation of the given pulse length), and wherein one or more conditions are fulfilled, as described above.

In preferred embodiments of the present invention, the transition point ($T_{RC}$) of each lens material of the first group satisfies the following condition: $0.05 \cdot H_D < T_{RC}$, preferably $0.1 \cdot H_D < T_{RC}$, and preferably $T_{RC} < 0.7 \cdot H_D$. Furthermore, the gradient $\partial(\Delta(n \cdot L)/L)/\partial H$ in the transition point of a given lens material can be considered when selecting a lens material for a lens with a given maximum design fluence value and/or a location with a maximum design gradient product. Generally, given the choice between two lens materials of similar or identical transition point $T_{RC}$, the lens material having the smaller gradient would be selected. In particularly preferred embodiments, each lens material in the first group has a characteristic gradient $\partial(\Delta(n \cdot L)/L)/\partial H$ in its transition point $T_{RC}$ which is smaller than $2 \cdot 10^{-7}/(\text{mJ}/\text{cm}^2)$, even more preferably smaller than $1.5 \cdot 10^{-7}/(\text{mJ}/\text{cm}^2)$ and most preferably smaller than $1.25 \cdot 10^{-7}/(\text{mJ}/\text{cm}^2)$.

Preferably, the maximum design fluence value of the respective lens is in the range of from about 0.001 mJ/cm$^2$ to about 0.05 mJ/cm$^2$.

In some embodiments of the projection exposure apparatus, more than 50%, preferably more than 75% of a total number of the plurality of lenses in at least one of the illumination optical system and the projection optical system are made of a lens material selected from the first group of lens materials.

According to the second aspect of the present invention, in the projection exposure system as described above, each location on the surface of each lens has a design fluence value associated therewith, the design fluence value representing a predetermined expected fluence that the respective location on the surface of the lens will be exposed to during a standard mode of operation of the projection exposure apparatus; and each location on the surface of each lens has a design fluence gradient value associated therewith, the design fluence gradient value representing a predetermined expected change of the design fluence value per unit length; and each lens has a first location with a maximum design gradient product ($P_D$) associated therewith, the maximum design gradient product representing a maximum product of the design fluence gradient value and the design fluence value at the location of the design fluence gradient value for the respective lens; and at least one lens is made of a lens material selected from a second group of lens materials wherein each lens of the second group has a characteristic transition point ($T_{RC}$) after exposure to a given number of pulses of radiation of a given pulse length, wherein each lens material of the second group will have rarefied after exposure to the given number of pulses of radiation of the given pulse length having any fluence value below the transition point ($T_{RC}$), and wherein each lens material of the second group will have densified after exposure to the given number of pulses of radiation of the given pulse length having any fluence value above the transition point ($T_{RC}$); wherein each lens material of the second group further has a characteristic minimum value ($H_{min}$) associated therewith, the minimum value representing a fluence value causing the greatest extent of rarefaction in the respective lens material after exposure to the given number of pulses of radiation of the given pulse length, and wherein the minimum value $H_{min}$ of each lens material of the second group-satisfies the following condition:

$$H_{min} < H_{GHmax}$$

wherein $H_{GHmax}$ represents the design fluence value at the location with the maximum design gradient product ($P_D$), and $H_{min}$ represents the minimum value of the respective lens material.

Different fluence values cause a different extent of density change, or more precisely a change in the relative optical path length $\Delta(n \cdot L)/L$. This may lead to tension in the material and thus degradation of optical performance.

A location on a surface of a lens may have the largest design fluence gradient value of all design fluence gradient values on the surface of the respective lens, but be situated in a location where the design fluence value is relatively small. A resulting decrease of optical performance may therefore be small. It has been found to be advantageous to determine a first location having a maximum design gradient product ($P_D$) associated therewith, wherein the maximum design gradient product represents a maximum product of the design fluence gradient value and the design fluence value at the location of the design fluence gradient value for the respective lens.

In some embodiments of the projection exposure apparatus according to the second aspect of the invention, the transition point ($T_{RC}$) of each lens material of the second group satisfies the following condition:

$$T_{RC} < H_{GHmax}$$

with $H_{GHmax}$ representing the design fluence value at the location with the maximum design gradient product ($P_D$), and $T_{RC}$ representing the transition point of the respective lens material.

In preferred embodiments of the invention according to the second aspect, in the projection exposure apparatus as defined above, the at least one lens is a lens in the projection optical system.

In the projection exposure apparatus according to at least the second aspect of the invention, the projection optical system has a pupil plane and an optical axis at least in a region of the pupil plane. Preferably, the at least one lens is located at a distance from the pupil plane along the optical axis, with the distance being shorter than a free diameter of the lens and preferably shorter than half the free diameter of the lens.

In some embodiments of the projection exposure apparatus according to the second aspect of the invention, more than 50% and even more preferably more than 75% of a total number of the plurality of lenses in at least one of the illumination optical system and the projection optical system are made of a lens material selected from the second group of lens materials.

In some embodiments of the present invention, more than 70% of the lenses of the projection optical system are made of the first fused silica material comprised in at least one of the first group and the second group of lens materials. In other embodiments, more than 70% of the lenses of the projection optical system are made of the first fused silica material comprised in at least one of the first group and the second group of lens materials.

The first and the second groups of lens materials may comprise the same lens materials or may differ with respect to at least one lens material.

Preferably, at least those lenses are made of the first fused silica material comprised in at least one of the first group and the second group of lens materials, that fulfil the following condition:

$$G_i < 0.8 \cdot G_D$$

wherein $G_i$ is an axial thickness of the $i^{th}$ lens, and $G_D$ is an average of all axial thickness of the lenses, wherein the axial thickness of each lens represents a thickness of the lens at a location on the optical axis. Further preferably, the lenses that fulfil this condition are lenses of negative refracting power. That is, it is advantageous if relatively thin lenses, which are preferably also exposed to high energy densities, are made of the first fused silica material.

In further preferred embodiments of the projection exposure apparatus according to the present invention, at least those lenses are made of the first fused silica material comprised in at least one of the first and second group of lens materials, that fulfil the following condition:

$$G_i > 1.2 \cdot G_D$$

wherein $G_i$ is an axial thickness of the $i^{th}$ lens, and $G_D$ is an average of all axial thickness of the lenses, wherein the axial thickness of each lens represents a thickness of the lens at a location on the optical axis. In other words, preferably in particular thick lenses are made of the first fused silica material.

Also preferred are those embodiments of the present invention wherein at least those lenses are made of the first fused silica material comprised in at least one of the first and second group of lens materials that fulfil the following condition:

$$D_i < 0.7 \cdot D_{max}$$

wherein $D_i$ is an effective diameter of the $i^{th}$ lens, and $D_{max}$ is a maximum effective diameter of a lens in the projection exposure system. That is, lenses that are only 70% of the size of the lenses having a largest diameter in the projection exposure apparatus, an in particular the projection exposure system, are made of the first fused silica material. In a so-called single-waist system, these lenses are typically situated in the waist, and are typically exposed to high energy densities.

In some embodiments of the invention according to both the first and second aspect, at least two lens materials selected from at least one of the first and second group of lens materials are fused silica materials.

Preferably, for each lens in the projection exposure apparatus where radiation-induced damage would lead to a deterioration of the optical performance, a lens material is individually selected according to the teaching of the present invention so as to reduce the radiation-induced deterioration of optical performance.

It has been found that UV-induced damage is closely linked to chemical properties of a material, which are strongly influenced by the manufacturing and/or treating method of the material.

In particular, it has been found that fused silica materials manufactured by direct deposition generally have a high transition point $T_{RC}$ and high OH-content, as described, for instance, in German Patent applications DE 101 59 961 A1 and DE 101 59 962 A1. This results in a relatively flowable material which allows for internal strains to be reduced by heating the material whereby the occurrence of stress-induced birefringence can be minimised. In addition, such materials tend to be less prone to show increased absorption of light as a result of exposure to radiation, and in particular high fluences. Typically, this direct deposition or vitrification method produces silica glass having OH-contents in the range of 450 to 1200 ppm and $H_2$-contents in the range of $10^{18}$ molecules/cm. However, $H_2$-contents may also be adjusted to values above and below $10^{18}$ molecules/cm³, for instance to less than $10^{17}$ molecules/cm³ or more than $10^{19}$ molecules/cm³, by setting a particular stoichiometry in the flame and/or an additional sintering step in a defined atmosphere.

Materials having a low transition point $T_{RC}$ generally result from a flame deposition process using a relatively cold flame, in the course of which a silica powder (fine silica particles), so-called soot, is deposited first, which in a subsequent step is sintered to form a glass material (vitrification). Material thus produced generally has a low OH-content (typically between several ppm and about 200 ppm by weight) and a relatively small content of impurities resulting in good homogeneity of the refractive index and very good transmittive properties.

Typically, soot methods produce silica materials having relatively low hydrogen contents. Methods for producing soot materials having a higher hydrogen content were subsequently developed. An example of a silica material having an increased hydrogen content may be found in European Patent No. 0483 752, wherein a lump of high-purity fused silica glass produced according to the soot method is re-melted in an atmosphere of noble gas and hydrogen, whereby hydrogen diffuses into the silica material and thus the hydrogen content therein is increased.

Further methods of obtaining materials produced according to the soot technique whilst increasing the hydrogen content have been developed by a number of glass manufacturers. An example of a fused silica glass blank suitable for use in the present invention and a method for its production are described, for instance in laid open U.S. patent application No. 2003/0115905 A1, the entire contents of which is incorporated by reference herein. Oxyhydrogen burners are used to deposit silica particles which form a porous soot body. After completion of the deposition process, the soot body is subjected to a dehydration treatment so as to obtain a homogeneous distribution of OH-groups throughout the soot material. Subsequently, the treated soot is sintered at a high temperature (vitrification). In a further step, the material is subjected to a homogenisation treatment, in which a radial profile of $H_2$-concentration is established such that its maximum deviation from a mean in the range of $10^{16}$ molecules/cm³ to $4 \cdot 10^{16}$ molecules/cm³ does not exceed 25%. The material thus obtained is much preferable to one obtained by the above-mentioned soot and re-melt technique, due to improved homogeneity of hydrogen throughout the material.

In U.S. patent application No. 2003/0051507 A1, the entire contents of which is incorporated by reference herein, a process for producing a synthetic silica glass optical component is described, wherein the process comprises a step of treating a synthetic silica glass at a temperature of from 300° C. to 600° C. in a hydrogen-containing atmosphere such as to obtain a synthetic silica glass optical component which has a hydrogen molecule content of at least $10^{17}$ molecules/cm³ and an OH-group concentration of at most 200 ppm.

In some embodiments of the present invention, the first fused silica material is a fused silica material manufactured exclusively by a soot process. In other exemplary embodiments, only a portion of the first fused silica material may be made by a soot process whereas another portion may be made by a different process, i.e. the first fused silica material comprises a mixture of a material manufactured by a soot process and at least one material produced by another type of process. Laid open U.S. patent application 2003/0115905 A1, the entire contents of which is incorporated by reference herein, discloses a method of producing an optical glass blank wherein a mixed fused silica glass is generated from a first and a second fused silica glass by mixing the two fused silica glasses in the course of a homogenisation treatment. In preferred embodiments of the described method, a first fused silica is made by a soot method and a second fused silica glass made by a direct deposition method.

It has turned out to be particular advantageous if the first fused silica material fulfils at least one of the following conditions:

(i) The first fused silica material exhibits relatively low induced absorption upon exposure to short wavelength radiation, in particular an induced absorption coefficient $k_{ind}$ of less than $10^{-3}$ cm$^{-1}$, which absorption coefficient represents a difference between a total absorption coefficient of the first fused silica material before exposure to radiation and a total absorption coefficient of the first fused silica material after a given exposure to radiation, in particular at least one of exposure 160 million pulses of radiation having a fluence of 5 mJ/cm² and a wavelength of 193.4 nm and exposure to 100 billion pulses of radiation having a fluence of 200 µJ/cm² and a wavelength of 193.4 nm.

(ii) The first fused silica material (comprised in at least one of the first and second group of lenses) comprises a fused silica material manufactured by depositing $SiO_2$-particles to form a porous soot body, followed by vitrification, which first fused silica material has a $H_2$-content of about $5 \cdot 10^{15}$ molecules/cm³ or more.

In exemplary embodiments, the first fused silica material may be further characterised in that it has an OH-content of from about 1 ppm to about 400 ppm (by weight), more preferably in a range of about 250 to about 350 ppm.

(iii) The first fused silica material comprises a fused silica material manufactured by depositing $SiO_2$-particles to form a porous soot body, followed by vitrification, which first fused silica material has an OH-content of about 50 ppm by weight or less, and preferably a $H_2$-content of about $10^{15}$ molecules/cm³ or more.

The first fused silica material is herein (also) described in terms of its manufacturing method, as, to date, it is not entirely clear whether the advantageous properties may be attributed to a chemical composition in general, or also depends on a microstructure of the thus manufactured material.

The hydrogen-molecule content or concentration, respectively, is determined by Raman spectrometry in accordance with the method according to V. S. Khotimchenko et al. ("Determining the Content of Hydrogen Dissolved in Quartz Glass Using the Methods of Raman Scattering and Mass Spectrometry", Zhurnal Prikladnoi Spektroskopii, 46(6), p. 987–997 (1986)).

The OH-content is determined by measuring IR-absorption according to the method of Dodd et al. ("Optical Determinations of OH in Fused Silica", J. Appl. Physics, p. 3911 (1966)).

In exemplary embodiments, the first fused silica material has at least one of a hydrogen ($H_2$) content of $2 \cdot 10^{16}$ to $4 \cdot 10^{16}$ molecules/cm$^3$, a SiH-content of less than $5 \cdot 10^{16}$ molecules/cm$^3$, a refractive index inhomogeneity of less than 2 ppm and a stress birefringence of less than 2 nm/cm. Preferably, the fused silica material has a glass structure which is essentially free of oxygen defect sites.

The refractive index inhomogeneity referred to above is determined by an interferometric method using light of 633 nm wavelength, with the refractive index inhomogeneity denoting a difference between a maximum value and a minimum value of the refractive index across a so-called "clear aperture" of a lens/optical element, i.e. a portion of the optical element used for transmission during exposure in the projection exposure system.

A second fused silica material may be formed according to one of the processes described above, for instance, but under different conditions, thus resulting in different chemical and/or structural properties whilst having an OH- and/or $H_2$-content in the desired range.

Preferably, out of a number of lens materials fulfilling the requirements according to the first and/or second aspect of the present invention, the lens material exhibiting at least one of the smallest radiation-induced absorption and smallest refractive index inhomogeneity and smallest birefringence would be chosen.

In a further exemplary embodiment of the present invention, at least one lens of the plurality of lenses is, made of calcium fluoride. In particular, should there be a lens in the projection exposure apparatus for which there is no suitable lens material having a transition point $T_{RC}$ suited to satisfy the conditions according to the first and/or second aspect of the present invention and should the fluence the respective lens is exposed to be in an upper range of fluence values (>0.05 mJ/cm$^2$), it may be preferable to use calcium fluoride as a lens material for the respective lens.

In some exemplary embodiments of the present invention, all lenses in at least the projection optical system which are not preferably made of calcium fluoride for the above reason, are selected according to the teaching of the present invention.

It is preferred that the light source comprised in the illumination optical system of the present invention, both according to the first and second aspect, is adapted to emit light of a wavelength in the UV-range of the spectrum. In particular, it is preferred that a substantial amount of the light emitted by the light source has a wavelength shorter than 200 nm. In exemplary embodiments, the light source is an excimer laser, and, in particular an ArF laser. In some exemplary embodiments, the wavelength of the light emitted by the light source is 193 nm. It is preferred that the characteristics of the lens materials, such as the transition point, are measured using a light source/laser of the same wavelength and/or emitting pulses of substantially the same pulse length as the light source of the projection exposure system the lens material is used in.

BRIEF DESCRIPTION OF THE DRAWINGS

In the following, an embodiment of the invention is explained in further detail with reference to Figures, wherein.

DETAILED DESCRIPTION OF THE PREFERRED EMBODIMENTS

Figure 1:
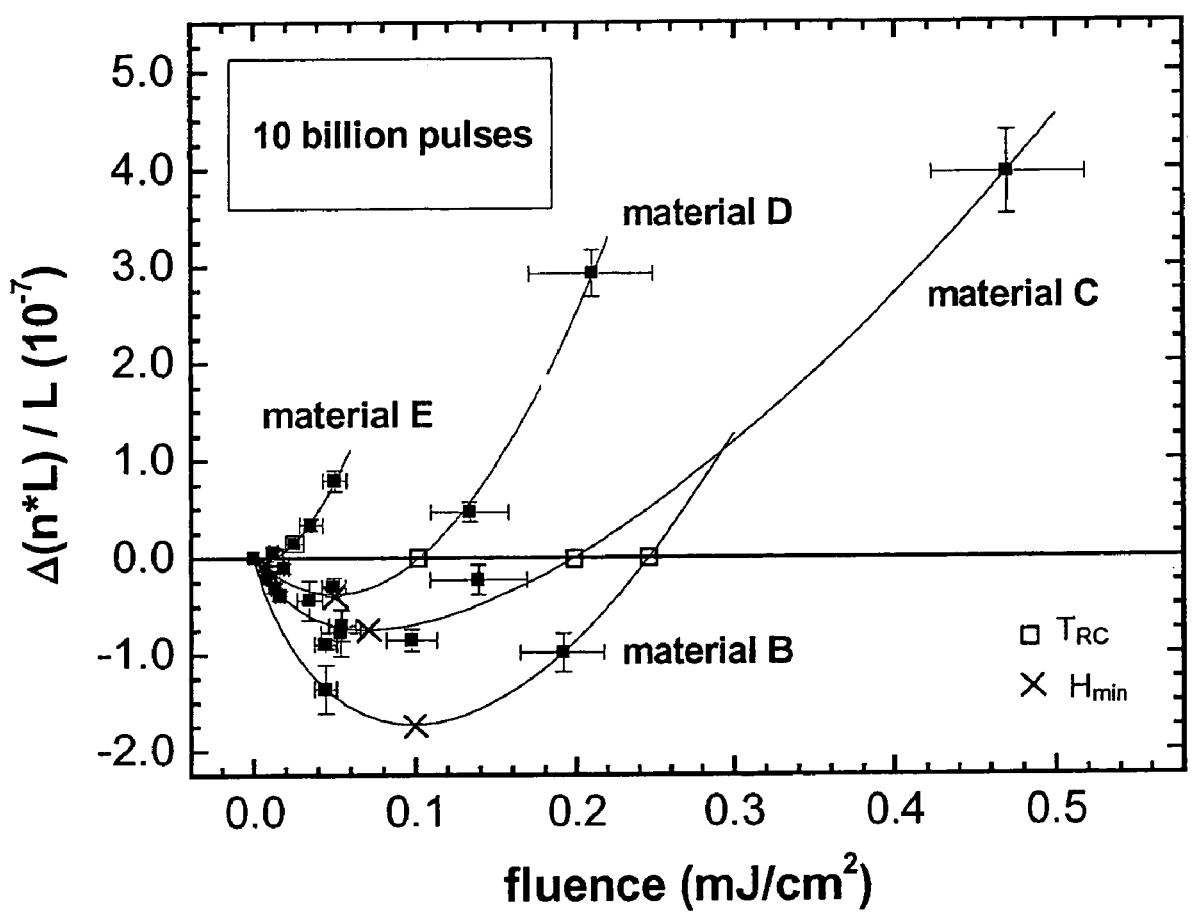
FIG. 1 illustrates a dependency of a relative optical path length difference of lens materials B to E on a fluence value the respective lens material was exposed to over 10 billion pulses.

FIG. 1 illustrates results from experiments in which 10 cm long samples of lens materials B to E were each exposed to 10 billion pulses of radiation having fluence values in the range of 0.01 to 0.5 mJ/cm$^2$. The relative optical path length difference $\Delta(n \cdot L)/L$ of the respective sample is plotted against the fluence value that the respective sample of the lens material was exposed to. The light source used was an ArF excimer laser emitting light of 193 nm wavelength ($\lambda$). The pulse length (more precisely: integral square pulse width) was about 25 ns. The relative optical path length difference $\Delta(n \cdot L)/L$ was measured using an interferometric method (using light of 633 nm wavelength).

As can be clearly seen in FIG. 1, each lens material shows a characteristic dependency of the change in physical properties on the exposure fluence value.

Each lens material can be characterised by a characteristic transition point ($T_{RC}$) which marks the fluence value upon radiation to which the lens material does not show any change in relative optical path length $\Delta(n \cdot L)/L$ after 10 billion pulses of radiation (of given, constant pulse width and wavelength). Furthermore, after exposure to 10 billion pulses of radiation having fluences which have smaller fluence values than the transition point ($T_{RC}$), the lens material has rarefied. On the other hand, after exposure to 10 billion pulses of radiation having fluences with values which are higher than the transition point ($T_{RC}$), the lens material has densified. Since the transition point may change to some degree during the course of an experiment, which could involve 30 billion pulses of radiation, for instance, a certain number of pulses may result in densification of a lens material whilst after further exposure to radiation of that fluence value, the material may start to rarefy, or vice versa.

In addition, the extent to which the different lens materials densified or rarefied after exposure to radiation, differs largely, as indicated by the value and sign of $\Delta(n \cdot L)/L$.

In addition to the transition point (after exposure to a given number of pulses of radiation of a given pulse length at a given wavelength), which is characteristic of a lens material, the extent to which radiation causes damage in a lens material can be further characterised by the minimum value $H_{min}$ which represents a fluence value causing the greatest extent of rarefaction in the respective lens material after exposure to the given number of pulses of radiation of the given pulse length (at the given wavelength).

In general, as can be seen in FIG. 1, the smaller the gradient $\partial(\Delta(n \cdot L)/L)/\partial H$ in the transition point of the given lens material, the smaller the greatest extent of damage due to rarefaction. In addition, a unit change in relative optical path length upon compaction is smaller over a given unit range of fluence values.

In Table 1, transition values $T_{RC}$, gradients $\partial(\Delta(n \cdot L)/L)/\partial H$ and minimum values $H_{min}$ of lens materials B to E after exposure to 10 billion pulses of radiation of about 25 ns pulse length and 193 nm wavelength are listed.

TABLE 1

| Lens material | Transition point $T_{RC}$ [mJ/cm$^2$] | Gradient $\partial(\Delta(n \cdot L)/L)/\partial H$ in transition point $T_{RC}$ [10$^{-7}$/(mJ/cm$^2$)] | Minimum value $H_{min}$ [mJ/cm$^2$] |
|---|---|---|---|
| E | <0.01 | ND | <0.01 |
| D | 0.1 | 14.0 | 0.05 |
| C | 0.2 | 9.4 | 0.07 |
| B | 0.25 | 17.2 | 0.1 |

ND = not determined

Figure 2:
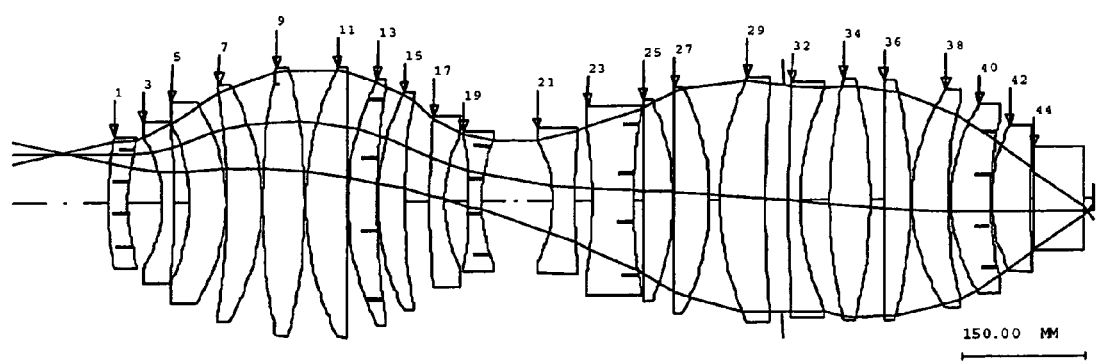
FIG. 2 shows an optical path diagram of a projection optical system according to a preferred embodiment of the present invention.

In FIG. 2, an optical path diagram of a projection optical system according to the preferred embodiment of the present invention is depicted.

The depicted projection optical system has a first lens group having a negative refractive power, a second lens group having a positive refractive power and a third lens group arranged in an optical path between the second lens group and a substrate. In the illustration shown in FIG. 2, the patterning structure would be positioned to the left of the projection optical system and the substrate, accordingly, to the right of the optical system.

Figure 3:
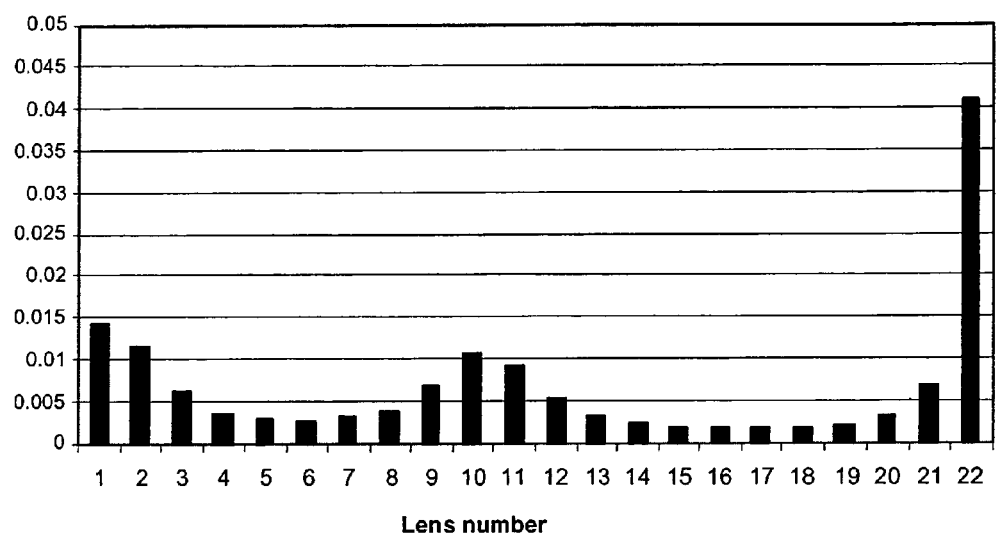
FIG. 3 shows a diagram illustrating the maximum design fluence values associated with each of the lenses of the projection optical system shown in FIG. 2.

In FIG. 3, a diagram listing the maximum design fluence value of each lens in the projection optical system according to the preferred embodiment of the present invention, as depicted in FIG. 2, is given. For the determination of the maximum design fluence values, the size of the illumination area, i.e. the field size on the substrate, was assumed to be 26×8,65 mm$^2$, the energy per pulse after the patterning structure was assumed to be 0,5 mJ and the sigma value of the illumination was assumed to be 0.85–0.55. It was further assumed that the patterning structure is an open frame patterning structure, i.e. does not comprise diffractive structures. These parameters define the standard mode of operation for the projection optical system according to the preferred embodiment of the present invention. The maximum design fluence value for each lens given herein is an average value of a maximum fluence value on a frontside and a maximum fluence value on a backside of the lens (with front and back of a lens relating to the direction in which light travels through the projection optical system).

Whilst in FIG. 2, the lenses are numbered with respect to an optical surface, with each lens having two optical surfaces, the numbering in FIG. 3 refers to the number assigned to the lens. In other words, numbers 1 and 2 relating to optical surfaces in FIG. 2 correspond to lens number 1 (which includes two optical surfaces with the numbering of FIG. 2) and so forth. It is to be noted that the denotation 31 is assigned to an aperture so that optical surfaces 32 and 33 correspond to lens number 16, and so forth for the following lenses.

As evident from FIG. 3, a characteristic maximum design fluence value is associated with each lens in the projection optical system according to the preferred embodiment of the present invention. Apart from lens 22, which is the lens closest to the substrate, each lens is associated with a maximum design fluence value of less than 0.15 mJ/cm$^2$.

It is already clear from FIG. 2, that—given the fact that the fluence of radiation passing through a certain lens is only decreased to a relatively small extent by absorption of the lenses preceding that certain lens in the projection optical system—in lenses positioned in so-called waists (lenses 10 and 11, for instance) the design fluence value is inherently higher than in lenses positioned in so-called bulges of the projection optical system (lenses 16, 17, 18, for instance).

In view of the teaching according to the first aspect of the present invention, the lens materials are selected such that the transition point $T_{RC}$ of a lens material to be used in a lens with a given maximum design fluence value is less than 80% of the maximum design fluence value of the respective lens.

In line with the above, out of materials B to E which were experimentally assessed, material E would be suitable at least for use in lenses 1 to 20 in the projection optical system according to the preferred embodiment of the present invention, while lenses 21 and 22 would preferably be made of calcium fluoride.

Material E will exhibit the smallest change in physical and thus optical properties out of lens materials B to E for the given projection exposure apparatus, and therefore allows for a deterioration of the optical performance of the projection exposure apparatus to be minimised.

Material E was manufactured by depositing SiO$_2$-particles to form a porous soot body, followed by vitrification (a soot process) and has a H$_2$-content of more than $5 \cdot 10^{15}$ molecules/cm$^3$ and an OH-content of less than 300 ppm. Material E also fulfils the condition $k_{ind} < 10^{-3}$ cm$^{-1}$.

The other materials depicted in FIG. 1 were manufactured according to a direct deposition process.

In Table 2 radius, thickness, refractive index, maximum optical height and material as well as data characterising aspheric surfaces are listed for each lens (optical surface) in the projection optical system according to the preferred embodiment of the present invention, as depicted in FIG. 2.

TABLE 2

| Optical Surface No. | Radius [mm] | Thickness [mm] | Material | Refractive Index @ 193.3000 nm | Maximum Optical Height [mm] |
|---|---|---|---|---|---|
| 1 | 386.19988 | 19.38360 | SiO$_2$ | 1.56033 | 67.050 |
| 2 | 176.11882 | 40.53680 | | | 68.526 |
| 3 | −120.27019 | 14.84418 | SiO$_2$ | 1.56033 | 70.253 |
| 4 | −752.34031 | 16.94739 | | | 84.216 |

TABLE 2-continued

| | | | | | |
|---|---|---|---|---|---|
| 5 | −193.68926 | 43.95744 | SiO$_2$ | 1.56033 | 85.404 |
| 6 | −193.11849 | 1.49881 | | | 104.803 |
| 7 | −800.41178 | 40.72524 | SiO$_2$ | 1.56033 | 118.036 |
| 8 | −241.01622 | 1.71589 | | | 124.021 |
| 9 | 665.86187 | 50.78774 | SiO$_2$ | 1.56033 | 138.801 |
| 10 | −543.47444 | 2.80038 | | | 140.548 |
| 11 | 299.94622 | 49.58076 | SiO$_2$ | 1.56033 | 140.861 |
| 12 | .00000 | 1.02804 | | | 138.234 |
| 13 | 280.05078 | 35.58140 | SiO$_2$ | 1.56033 | 128.813 |
| 14 | 1031.33951 | .96637 | | | 124.077 |
| 15 | 254.95106 | 30.21404 | CaF$_2$ | 1.50146 | 114.341 |
| 16 | 625.47047 | 30.56660 | | | 108.049 |
| 17 | 760.28968 | 19.14690 | SiO$_2$ | 1.56033 | 89.205 |
| 18 | 144.33889 | 30.26912 | | | 73.547 |
| 19 | −387.19169 | 14.93546 | SiO$_2$ | 1.56033 | 72.246 |
| 20 | 171.27822 | 88.21994 | | | 66.515 |
| 21 | −128.87969 | 26.37371 | SiO$_2$ | 1.56033 | 66.011 |
| 22 | 804.56997 | 21.67043 | | | 75.669 |
| 23 | −568.56534 | 51.55244 | SiO$_2$ | 1.56033 | 80.499 |
| 24 | 956.27680 | 10.22974 | | | 99.920 |
| 25 | .00000 | 35.85153 | CaF$_2$ | 1.50146 | 101.446 |
| 26 | −249.55109 | .95857 | | | 106.518 |
| 27 | .00000 | 41.59329 | CaF$_2$ | 1.50146 | 116.446 |
| 28 | −262.54616 | 13.12952 | | | 119.692 |
| 29 | 289.97809 | 56.26040 | SiO$_2$ | 1.56033 | 129.520 |
| 30 | 1741.16072 | 23.41975 | | | 127.099 |
| 31 | .00000 | 3.55767 | | | 126.003 |
| 32 | .00000 | 15.04007 | SiO$_2$ | 1.56033 | 125.837 |
| 33 | 277.04146 | 34.69651 | | | 125.229 |
| 34 | 533.64771 | 48.11803 | SiO$_2$ | 1.56033 | 132.624 |
| 35 | −472.16456 | 15.66299 | | | 133.948 |
| 36 | .00000 | 33.04508 | SiO$_2$ | 1.56033 | 134.246 |
| 37 | −487.18119 | 2.64145 | | | 134.323 |
| 38 | 199.05870 | 42.54712 | SiO$_2$ | 1.56033 | 124.088 |
| 39 | 434.43189 | 3.67554 | | | 118.385 |
| 40 | 169.01722 | 49.50387 | SiO$_2$ | 1.56033 | 107.633 |
| 41 | 298.66572 | 1.67775 | | | 94.103 |
| 42 | 154.30305 | 45.98675 | CaF$_2$ | 1.50146 | 84.498 |
| 43 | 521.18603 | 5.74402 | | | 66.687 |
| 44 | .00000 | 60.36445 | CaF$_2$ | 1.50146 | 64.803 |
| 45 | 1664.80044 | 11.12816 | | | 27.285 |
| 46 | .00000 | .00000 | | | 13.701 |
| 47 | .00000 | .00000 | | | 13.701 |

Parameters of aspheres

ASPHERE on optical surface 2

EX = 0.0000000000
C1 = −0.1043917000E−06
C2 = 0.1993670000E−11
C3 = −0.6185713000E−16
C4 = 0.1556706400E−20

ASPHERE on optical surface 14

EX = 0.0000000000
C1 = 0.4169658600E−08
C2 = 0.5137078300E−13
C3 = −0.6364813600E−18
C4 = 0.1129830800E−22

ASPHERE on optical surface 20

EX = 0.0000000000
C1 = 0.1666894400E−07
C2 = 0.4193249900E−12
C3 = −0.1801738500E−16
C4 = −0.1347985100E−20

ASPHERE on optical surface 24

EX = 0.0000000000
C1 = 0.3620785900E−07
C2 = −0.6809213800E−12
C3 = −0.1284953000E−16
C4 = 0.9165474500E−21
C5 = −0.1237945300E−25

ASPHERE on optical surface 41

EX = 0.0000000000
C1 = −0.1794384500E−07
C2 = 0.1511387500E−12
C3 = −0.1517314900E−17
C4 = −0.5376865700E−21
C5 = 0.1957226900E−25
C6 = −0.5603461800E−30

It is to be noted that lenses 8, 13 and 14 are not made of calcium fluoride because of potential radiation-induced damage but for reasons of optimisation of chromatic aberrations.

Figure 4:
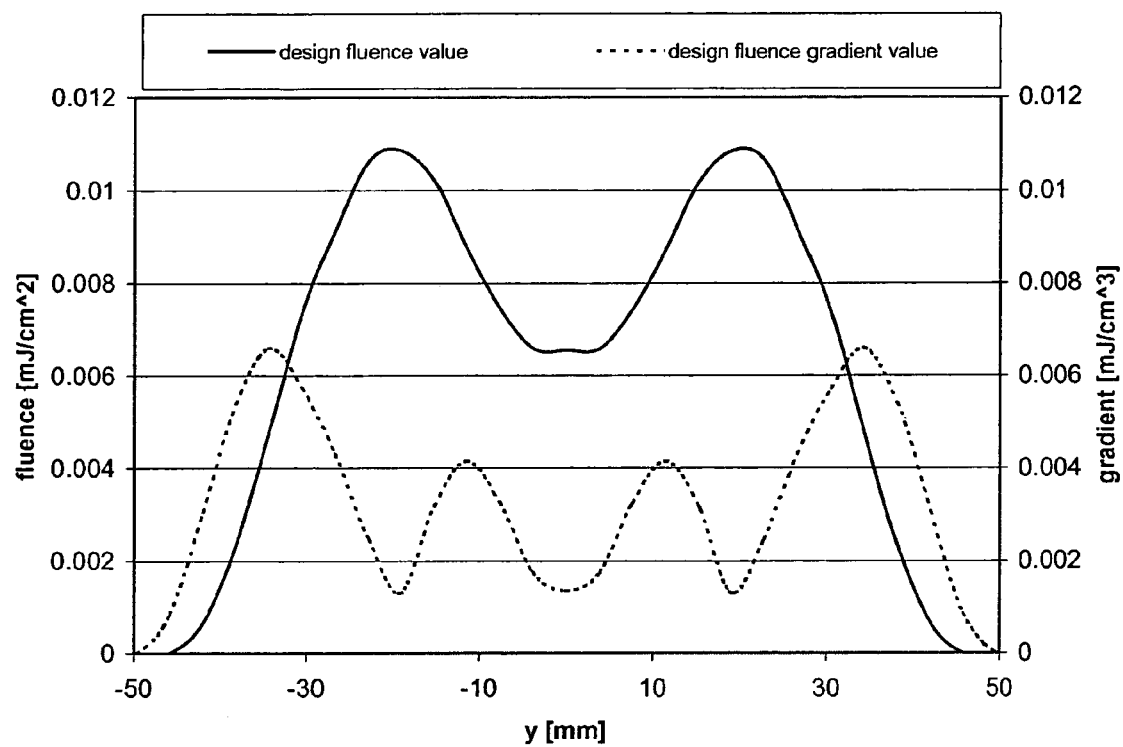
FIG. 4 shows a diagram illustrating a distribution of design fluence values as well as associated design fluence gradient values across a surface of a lens of the projection optical system shown in FIG. 2.

In FIG. 4, a distribution of design fluence values across a surface of a lens is illustrated. From the change of the design fluence values per unit length(s), design gradient fluence values can be determined. A distribution of the determined design gradient fluence values across the surface of the respective lens is also depicted in FIG. 4. The reason why the design gradient fluence value does not reach a zero value, as would be expected, at about +20 and about −20 mm is due to the relatively large unit lengths chosen for the determination of the design gradient fluence values.

Figure 5:
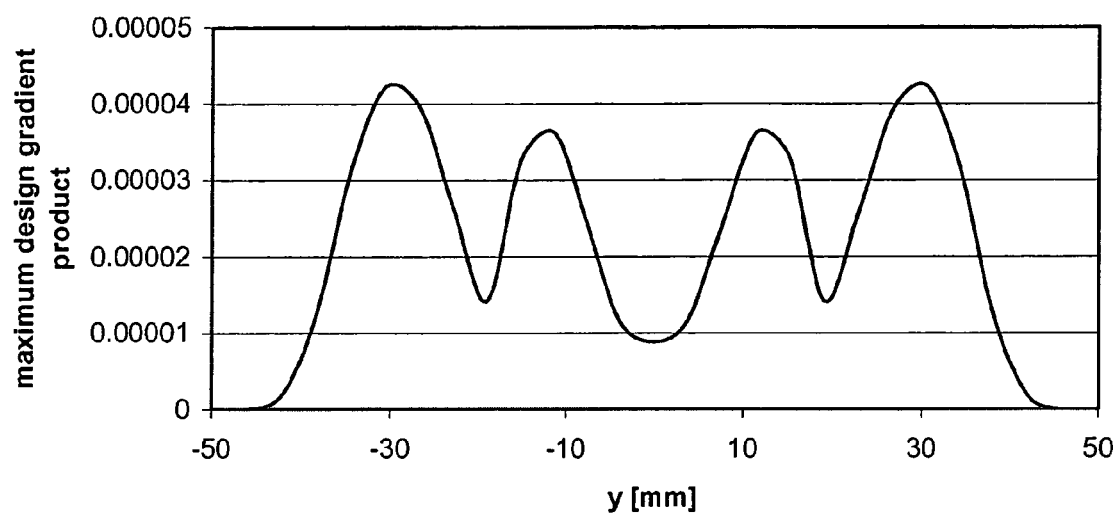
FIG. 5 shows a diagram illustrating a distribution of design gradient products resulting from the distribution shown in FIG. 4.

The diagram in FIG. 5 depicts values of design gradient products resulting from the distribution of design fluence values and the associated design fluence gradient values across the surface of the lens of the projection optical system depicted in FIG. 4. As can be seen in the graph, the maximum design gradient product $P_D$ is positioned at an x-coordinate of about +30 and about −30 mm on the surface of the lens. According to the teaching of the present invention, the design fluence value at the location of the maximum design gradient product is determined, which, as can be derived from FIG. 4, is about 0,075 mJ/cm².

A lens material suitable for this lens is then selected from the second group of lens materials, in which each lens satisfies the condition: $H_{min} < H_{GHmax}$. Thus, a lens material which has a minimum value $H_{min}$ smaller than the design fluence value at the location with the maximum design gradient product would be, for instance, one of materials D and E.

The lens material for the above-described lens may be further selected such that the condition $T_{RC} < H_{GHmax}$ is satisfied. According to this teaching, material E would be selected.

Figure 6:
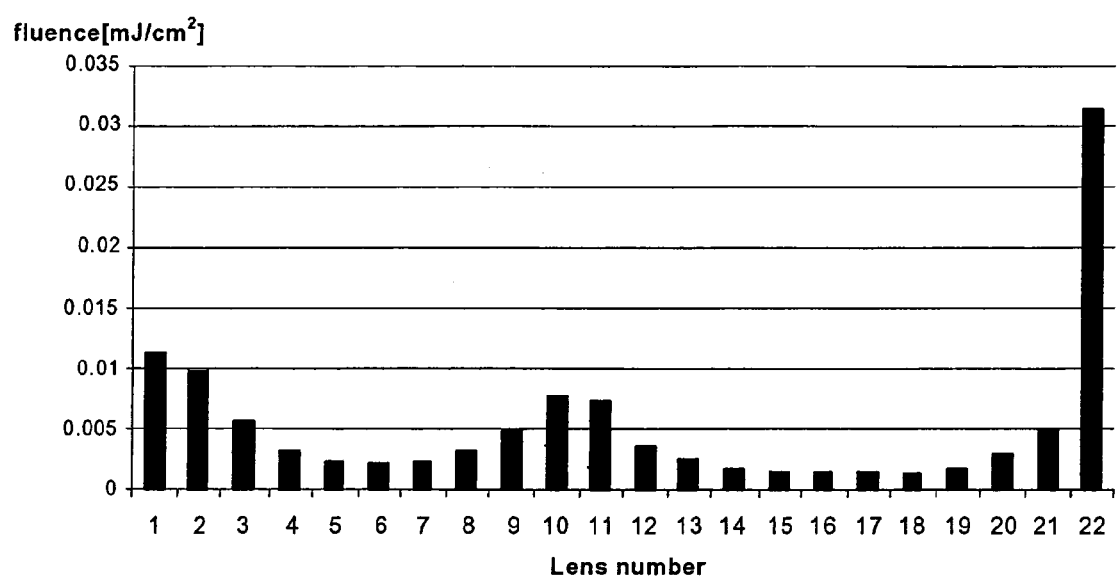
FIG. 6 shows a diagram illustrating the design fluence values at the locations with the maximum design gradient products of the lenses in the projection optical system shown in FIG. 2.

In FIG. 6, the design fluence values at the locations of the maximum design gradient products are given for the lenses of the projection optical system according to the preferred embodiment of the present invention depicted in FIG. 2. Lens materials for lenses not made of calcium fluoride, as described above, are selected such that the minimum value $H_{min}$ of the respective lens material is smaller than the design fluence value at the location of the maximum design gradient product.

In accordance with the teaching of the present invention according to the first and second aspect, lens materials for one or more lenses in the optical systems can be selected such that a decrease in optical performance of a lens or a lens assembly due to UV-induced damage of the lens material and phenomena associated therewith, for instance wavefront distortion, can at least be reduced.

Whilst the preferred embodiment was directed to a projection optical system comprising merely refractive components, the teaching of the present invention is equally applicable to catadioptric designs.

The present invention has been described by way of an exemplary embodiment to which it is not limited. Variations and modifications will occur to those skilled in the art without departing from the scope of the invention as described in the claims appended hereto.

We claim:

1. A projection exposure apparatus comprising:
    an illumination optical system including a light source for illuminating a patterning structure;
    a projection optical system for projecting an image of the illuminated patterning structure onto a substrate;
    the illumination optical system and the projection optical system each comprising a plurality of lenses;
    wherein each of the lenses has a maximum design fluence value associated therewith, the maximum design fluence value representing a predetermined expected maximum fluence that the respective lens will be exposed to during a standard mode of operation of the projection exposure apparatus;
    at least one lens being made of a lens material selected from a first group of lens materials wherein, after exposure to a given number of pulses of radiation of a given pulse length, each lens material of the first group has a characteristic transition point representative of a fluence value,
    wherein each lens material of the first group will have rarefied after exposure to the given number of pulses of radiation of the given pulse length having any fluence value below its transition point, and wherein each lens material of the first group will have densified after exposure to the given number of pulses of radiation of the given pulse length having any fluence value above its transition point; and
    wherein the transition point of each lens material of the first group satisfies the following condition:

$T_{RC} < 0.8 \cdot H_D$ wherein $T_{RC}$ represents the transition point of the respective lens material, $H_D$ represents the design fluence value of the respective lens, and
    wherein at least one lens is made of a first fused silica material comprised in the first group of lens materials, wherein a transmittance of the first fused silica material obeys the relationship $T = 10^{-(k_0 + k_{ind}) \cdot l}$ with
    T denoting the transmittance,
    $k_0$ being an absorption coefficient of the first fused silica material before exposure to light of a wavelength of 193.4 nm,
    $k_0 + k_{ind}$ being a total absorption coefficient after the first fused silica material has been exposed to 160 million pulses of radiation having a fluence of 5 mJ/cm² and a wavelength of 193.4 nm,
    and l being a length of a path of light through the first fused silica material,
    and wherein the following condition is fulfilled:

$k_{ind} < 10^{-3}$ cm$^{-1}$.

2. The projection exposure apparatus according to claim 1, wherein $0.05 \cdot H_D < T_{RC} < 0.8 \cdot H_D$.

3. The projection exposure apparatus according to claim 1, wherein $0.1 \cdot H_D < T_{RC} < 0.7 \cdot H_D$.

4. The projection exposure apparatus according to claim 1, wherein $0.001$ mJ/cm² $< H_D < 0.05$ mJ/cm².

5. The projection exposure apparatus according to claim 1, wherein at least those lenses are made of the first fused silica material comprised in the first group of lens materials that fulfil the following condition:

$G_i < 0.8 \cdot G_D$ wherein $G_i$ is an axial thickness of the $i^{th}$ lens, and $G_D$ is an average of all axial thickness of the lenses, wherein the axial thickness of each lens represents a thickness of the lens at a location on the optical axis.

6. The projection exposure apparatus according to claim 1, wherein at least those lenses are made of the first fused silica material comprised in the first group of lens materials that fulfil the following condition:

$$G_i > 1.2 \cdot G_D$$

wherein $G_i$ is an axial thickness of the $i^{th}$ lens, and $G_D$ is an average of all axial thickness of the lenses, wherein the axial thickness of each lens represents a thickness of the lens at a location on the optical axis.

7. The projection exposure apparatus according to claim 1, wherein at least those lenses are made of the first fused silica material comprised in the first group of lens materials that fulfil the following condition:

$$D_i < 0.7 \cdot D_{max}$$

wherein $D_i$ is an effective diameter of the $i^{th}$ lens, and $D_{max}$ is a maximum effective diameter of a lens in the projection exposure system.

8. The projection exposure apparatus according to claim 1, wherein more than 50% of the total number of lenses in at least one of the illumination optical system and the projection optical system are made of a lens material selected from the first group of lens materials.

9. The projection exposure apparatus according to claim 1, wherein more than 75% of the total number of lenses in at least one of the illumination optical system and the projection optical system are made of a lens material selected from the first group of lens materials.

10. The projection exposure apparatus according to claim 1, wherein more than 70% of the lenses of the projection optical system are made of the first fused silica material comprised in the first group of lens materials.

11. The projection exposure apparatus according to claim 1, wherein at least two lens materials selected from the first group of lens materials are fused silica materials.

12. The projection exposure apparatus according to claim 1, wherein at least one lens of the plurality of lenses is made of calcium fluoride.

13. The projection exposure apparatus according to claim 1, wherein the light source is adapted to emit light a substantial amount of which has a wavelength shorter than 200 nm.

14. The projection exposure apparatus according to claim 13, wherein the light source is an excimer laser.

15. The projection exposure apparatus according to claim 13, wherein the light source is an ArF laser.

16. The projection exposure apparatus according to claim 1, wherein the given number of pulses of radiation is 10 billion and the given pulse length is 25 ns.

17. Projection exposure apparatus comprising:

an illumination optical system including a light source for illuminating a patterning structure;

a projection optical system for projecting an image of the illuminated patterning structure onto a substrate;

the illumination optical system and the projection optical system each comprising a plurality of lenses;

wherein each location on a surface of each lens has a design fluence value associated therewith, the design fluence value representing a predetermined expected fluence that the respective location on the surface of the lens will be exposed to during a standard mode of operation of the projection exposure apparatus;

wherein each location on the surface of each lens has a design fluence gradient value associated therewith, the design fluence gradient value representing a predetermined expected change of the design fluence value per unit length;

and wherein each lens has a first location with a maximum design gradient product associated therewith, the maximum design gradient product representing a maximum product of the design fluence gradient value and the design fluence value at the location of the design fluence gradient value for the respective lens;

at least one lens being made of a lens material selected from a second group of lens materials wherein each lens of the second group has a characteristic transition point after exposure to a given number of pulses of radiation of a given pulse length, wherein each lens material will have rarefied after exposure to the given number of pulses of radiation of the given pulse length having any fluence value below the transition point, and wherein each lens material will densified after exposure to the given number of pulses of radiation of the given pulse length having any fluence value above the transition point;

wherein each lens material further has a characteristic minimum value associated therewith, the minimum value representing a fluence value causing the greatest extent of rarefaction in the lens material after exposure to the given number of pulses of radiation of the given pulse length, and wherein the minimum value $H_{min}$ of each lens material of the second group satisfies the following condition:

$$H_{min} < H_{GHmax}$$

wherein $H_{GHmax}$ represents the design fluence value at the location with the maximum design gradient product, and $H_{min}$ represents the minimum value of the respective lens material, and wherein at least one lens is made of a first fused silica material comprised in the second group of lens materials, wherein a transmittance of the first fused silica material obeys the relationship $$T = 10^{-(k_0 + k_{ind}) \cdot l}$$

with

T denoting the transmittance, $k_0$ being an absorption coefficient of the first fused silica material before exposure to light of a wavelength of 193.4 nm, $k_0 + k_{ind}$ being a total absorption coefficient after the first fused silica material has been exposed to 160 million pulses of radiation having a fluence of 5 mJ/cm² and a wavelength of 193.4 nm, and l being a length of a path of light through the first fused silica material, and wherein the following condition is fulfilled:

$$k_{ind} < 10^{-3} \text{ cm}^{-1}.$$

18. The projection exposure apparatus according to claim 17, wherein the transition point of each lens material of the second group satisfies the following condition:

$$T_{RC} < H_{GHmax}$$

wherein H$_{GHmax}$ represents the design fluence value at the location with the maximum design gradient product, and T$_{RC}$ represents the transition point of the respective lens material.

19. The projection exposure apparatus according to claim 17, wherein the at least one lens is a lens in the projection optical system.

20. The projection exposure apparatus according to claim 17,
wherein the projection optical system has a pupil plane,
wherein the projection optical system has an optical axis at least in a region of the pupil plane, and
wherein the lens is located at a distance from the pupil plane along the optical axis and
wherein the distance is shorter than a free diameter of the lens.

21. The projection exposure apparatus according to claim 20, wherein the distance is shorter than half of the free diameter of the lens.

22. The projection exposure apparatus according to claim 17, wherein more than 50% of a total number of the plurality of lenses in at least one of the illumination optical system and the projection optical system are made of a lens material selected from the second group of lens materials.

23. The projection exposure apparatus according to claim 22, wherein more than 75% of the total number of lenses in at least one of the illumination optical system and the projection optical system are made of a lens material selected from the second group of lens materials.

24. The projection exposure apparatus according to claim 17, wherein more than 70% of the lenses in at least one of the illumination optical system and the projection optical system are made of the first fused silica material comprised in the second group of lens materials.

25. The projection exposure apparatus according to claim 17, wherein at least two lens materials selected from the second group of lens materials are fused silica materials.

26. The projection exposure apparatus according to claim 17, wherein at least one lens of the plurality of lenses is made of calcium fluoride.

27. The projection exposure apparatus according to claim 17, wherein the light source is adapted to emit light a substantial amount of which has a wavelength shorter than 200 nm.

28. The projection exposure apparatus according to claim 27, wherein the light source is an excimer laser.

29. The projection exposure apparatus according to claim 27, wherein the light source is an ArF laser.

30. The projection exposure apparatus according to claim 17, wherein the given number of pulses of radiation is 10 billion and the given pulse length is 25 ns.

31. A projection exposure apparatus comprising:
an illumination optical system including a light source for illuminating a patterning structure;
a projection optical system for projecting an image of the illuminated patterning structure onto a substrate;
the illumination optical system and the projection optical system each comprising a plurality of lenses;
wherein each of the lenses has a maximum design fluence value associated therewith, the maximum design fluence value representing a predetermined expected maximum fluence that the respective lens will be exposed to during a standard mode of operation of the projection exposure apparatus;
at least one lens being made of a lens material selected from a first group of lens materials wherein, after exposure to a given number of pulses of radiation of a given pulse length, each lens material of the first group has a characteristic transition point representative of a fluence value,
wherein each lens material of the first group will have rarefied after exposure to the given number of pulses of radiation of the given pulse length having any fluence value below its transition point, and wherein each lens material of the first group will have densified after exposure to the given number of pulses of radiation of the given pulse length having any fluence value above its transition point; and
wherein the transition point of each lens material of the first group satisfies the following condition:

$T_{RC} < 0.8 \cdot H_D$ wherein T$_{RC}$ represents the transition point of the respective lens material, H$_D$ represents the design fluence value of the respective lens, and
wherein at least one lens is made of a first fused silica material comprised in the first group of lens materials, which first fused silica material comprises a fused silica material manufactured by depositing SiO$_2$-particles to form a porous soot body, followed by vitrification, which first fused silica material has a H$_2$-content of about $5 \cdot 10^{15}$ molecules/cm$^3$ or more.

32. A projection exposure apparatus comprising:
an illumination optical system including a light source for illuminating a patterning structure;
a projection optical system for projecting an image of the illuminated patterning structure onto a substrate;
the illumination optical system and the projection optical system each comprising a plurality of lenses;
wherein each of the lenses has a maximum design fluence value associated therewith, the maximum design fluence value representing a predetermined expected maximum fluence that the respective lens will be exposed to during a standard mode of operation of the projection exposure apparatus;
at least one lens being made of a lens material selected from a first group of lens materials wherein, after exposure to a given number of pulses of radiation of a given pulse length, each lens material of the first group has a characteristic transition point representative of a fluence value,
wherein each lens material of the first group will have rarefied after exposure to the given number of pulses of radiation of the given pulse length having any fluence value below its transition point, and wherein each lens material of the first group will have densified after exposure to the given number of pulses of radiation of the given pulse length having any fluence value above its transition point; and
wherein the transition point of each lens material of the first group satisfies the following condition:

$T_{RC} < 0.8 \cdot H_D$ wherein T$_{RC}$ represents the transition point of the respective lens material, H$_D$ represents the design fluence value of the respective lens, and
wherein at least one lens is made of a first fused silica material comprised in the first group of lens materials, which first fused silica material comprises a fused silica material manufactured by depositing SiO$_2$-particles to form a porous soot body, followed by vitrification, which first fused silica material has an OH-content of about 50 ppm by weight or less.

33. The projection exposure apparatus according to claim 32, wherein the first fused silica material has a $H_2$-content of about $10^{15}$ molecules/cm$^3$ or more.

34. Projection exposure apparatus comprising:

an illumination optical system including a light source for illuminating a patterning structure;

a projection optical system for projecting an image of the illuminated patterning structure onto a substrate;

the illumination optical system and the projection optical system each comprising a plurality of lenses;

wherein each location on a surface of each lens has a design fluence value associated therewith, the design fluence value representing a predetermined expected fluence that the respective location on the surface of the lens will be exposed to during a standard mode of operation of the projection exposure apparatus;

wherein each location on the surface of each lens has a design, fluence gradient value associated therewith, the design fluence gradient value representing a predetermined expected change of the design fluence value per unit length;

and wherein each lens has a first location with a maximum design gradient product associated therewith, the maximum design gradient product representing a maximum product of the design fluence gradient value and the design fluence value at the location of the design fluence gradient value for the respective lens;

at least one lens being made of a lens material selected from a second group of lens materials wherein each lens of the second group has a characteristic transition point after exposure to a given number of pulses of radiation of a given pulse length, wherein each lens material will have rarefied after exposure to the given number of pulses of radiation of the given pulse length having any fluence value below the transition point, and wherein each lens material will densified after exposure to the given number of pulses of radiation of the given pulse length having any fluence value above the transition point;

wherein each lens material further has a characteristic minimum value associated therewith, the minimum value representing a fluence value causing the greatest extent of rarefaction in the lens material after exposure to the given number of pulses of radiation of the given pulse length, and wherein the minimum value $H_{min}$ of each lens material of the second group satisfies the following condition:

$$H_{min} < H_{GHmax}$$

wherein $H_{GHmax}$ represents the design fluence value at the location with the maximum design gradient product, and $H_{min}$ represents the minimum value of the respective lens material, and wherein at least one lens is made of a first fused silica material comprised in the second group of lens materials, which first fused silica material comprises a fused silica material manufactured by depositing SiO$_2$-particles to form a porous soot body, followed by vitrification, which first fused silica material has a $H_2$-content of about $5\cdot10^{15}$ molecules/cm$^3$ or more.

35. Projection exposure apparatus comprising:

an illumination optical system including a light source for illuminating a patterning structure;

a projection optical system for projecting an image of the illuminated patterning structure onto a substrate;

the illumination optical system and the projection optical system each comprising a plurality of lenses;

wherein each location on a surface of each lens has a design fluence value associated therewith, the design fluence value representing a predetermined expected fluence that the respective location on the surface of the lens will be exposed to during a standard mode of operation of the projection exposure apparatus;

wherein each location on the surface of each lens has a design fluence gradient value associated therewith, the design fluence gradient value representing a predetermined expected change of the design fluence value per unit length;

and wherein each lens has a second location with a maximum design gradient product associated therewith, the maximum design gradient product representing a maximum product of the design fluence gradient value and the design fluence value at the location of the design fluence gradient value for the respective lens;

at least one lens being made of a lens material selected from a second group of lens materials wherein each lens of the second group has a characteristic transition point after exposure to a given number of pulses of radiation of a given pulse length, wherein each lens material will have rarefied after exposure to the given number of pulses of radiation of the given pulse length having any fluence value below the transition point, and wherein each lens material will densified after exposure to the given number of pulses of radiation of the given pulse length having any fluence value above the transition point;

wherein each lens material further has a characteristic minimum value associated therewith, the minimum value representing a fluence value causing the greatest extent of rarefaction in the lens material after exposure to the given number of pulses of radiation of the given pulse length, and wherein the minimum value $H_{min}$ of each lens material of the second group satisfies the following condition:

$$H_{min} < H_{GHmax}$$

wherein $H_{GHmax}$ represents the design fluence value at the location with the maximum design gradient product, and $H_{min}$ represents the minimum value of the respective lens material, and wherein at least one lens is made, of a first fused silica material comprised in the second group of lens materials, which first fused silica material comprises a fused silica material manufactured by depositing SiO$_2$-particles to form a porous soot body, followed by vitrification, which first fused silica material has an OH-content of about 50 ppm by weight or less.

36. The projection exposure apparatus according to claim 35, wherein the first fused silica material has a $H_2$-content of about $10^{15}$ molecules/cm$^3$ or more.

37. A projection exposure apparatus comprising:

an illumination optical system including a light source for illuminating a patterning structure;

a projection optical system for projecting an image of the illuminated patterning structure onto a substrate;

the illumination optical system and the projection optical system each comprising a plurality of lenses;

wherein each of the lenses has a maximum design fluence value associated therewith, the maximum design fluence value representing a predetermined expected maximum fluence that the respective lens will be exposed to during a standard mode of operation of the projection exposure apparatus;

wherein more than 50% of a total number of the plurality of lenses in at least one of the illumination optical system and the projection optical system are made of a lens material selected from a first group of lens materials wherein, after exposure to a given number of pulses of radiation of a given pulse length, each lens material of the first group has a characteristic transition point representative of a fluence value, wherein each lens material of the first group will have rarefied after exposure to the given number of pulses of radiation of the given pulse length having any fluence value below its transition point, and wherein each lens material of the first group will have densified after exposure to the given number of pulses of radiation of the given pulse length having any fluence value above its transition point; and wherein the transition point of each lens material of the first group satisfies the following condition:

$$T_{RC} < 0.8 \cdot H_D$$

wherein $T_{RC}$ represents the transition point of the respective lens material, $H_D$ represents the design fluence value of the respective lens.

38. Projection exposure apparatus comprising:

an illumination optical system including a light source for illuminating a patterning structure;

a projection optical system for projecting an image of the illuminated patterning structure onto a substrate;

the illumination optical system and the projection optical system each comprising a plurality of lenses;

wherein each location on a surface of each lens has a design fluence value associated therewith, the design fluence value representing a predetermined expected fluence that the respective location on the surface of the lens will be exposed to during a standard mode of operation of the projection exposure apparatus;

wherein each location on the surface of each lens has a design fluence gradient value associated therewith, the design fluence gradient value representing a predetermined expected change of the design fluence value per unit length;

and wherein each lens has a first location with a maximum design gradient product associated therewith, the maximum design gradient product representing a maximum product of the design fluence gradient value and the design fluence value at the location of the design fluence gradient value for the respective lens;

wherein more than 50% of a total number of the plurality of lenses in at least one of the illumination optical system and the projection optical system are made of a lens material selected from a second group of lens materials wherein each lens of the second group has a characteristic transition point after exposure to a given number of pulses of radiation of a given pulse length, wherein each lens material will have rarefied after exposure to the given number of pulses of radiation of the given pulse length having any fluence value below the transition point, and wherein each lens material will densified after exposure to the given number of pulses of radiation of the given pulse length having any fluence value above the transition point;

wherein each lens material further has a characteristic minimum value associated therewith, the minimum value representing a fluence value causing the greatest extent of rarefaction in the lens material after exposure to the given number of pulses of radiation of the given pulse length, and wherein the minimum value $H_{min}$ of each lens material of the second group satisfies the following condition:

$$H_{min} < H_{GHmax}$$

wherein $H_{GHmax}$ represents the design fluence value at the location with the maximum design gradient product, and $H_{min}$ represents the minimum value of the respective lens material.

* * * * *

UNITED STATES PATENT AND TRADEMARK OFFICE
CERTIFICATE OF CORRECTION

PATENT NO. : 6,992,753 B2
DATED : January 31, 2006
INVENTOR(S) : Daniel Krähmer et al.

It is certified that error appears in the above-identified patent and that said Letters Patent is hereby corrected as shown below:

Column 11,
Line 11, "...each lens material of the second group-satisfies..." should read -- ...each lens material of the second group satisfies... --;

Column 13,
Line 14, "...$10^{18}$ molecules/cm. However, $H_2$-contents may also be..." should read -- ...$10^{18}$ molecules/cm$^3$. However, $H_2$-contents may also be... --;

Column 15,
Line 38, "...at least one lens of the plurality of lenses is, made of..." should read -- ...at least one lens of the plurality of lenses is made of... --; and Column 28,
Line 47, "...wherein at least one lens is made, of a first fused silica..." should read -- ... wherein at least one lens is made of a first fused silica... --.

Signed and Sealed this

Twenty-fifth Day of April, 2006

JON W. DUDAS
*Director of the United States Patent and Trademark Office*